(12) United States Patent
Lee et al.

(10) Patent No.: US 7,511,573 B2
(45) Date of Patent: Mar. 31, 2009

(54) INPUT/OUTPUT SIGNALS PRESERVER CIRCUIT OF AMPLIFICATION CIRCUITS

(75) Inventors: Jong-Ryul Lee, Bucheon-si (KR); Jong-Seok Lee, 220-10, Chunul-dong, Wonmi-gu, Bucheon-si, Gyeonggi-do, 420-857 (KR)

(73) Assignee: Jong-Seok Lee, Gyeonggi-Do (KR)

( * ) Notice: Subject to any disclaimer, the term of this patent is extended or adjusted under 35 U.S.C. 154(b) by 156 days.

(21) Appl. No.: 10/574,528

(22) PCT Filed: Sep. 24, 2004

(86) PCT No.: PCT/KR2004/002465

§ 371 (c)(1),
(2), (4) Date: Mar. 30, 2006

(87) PCT Pub. No.: WO2005/031968

PCT Pub. Date: Apr. 7, 2005

(65) Prior Publication Data

US 2007/0069812 A1     Mar. 29, 2007

(30) Foreign Application Priority Data

Sep. 30, 2003   (KR) .................. 10-2003-0067740

(51) Int. Cl.
*H03G 3/20* (2006.01)

(52) U.S. Cl. ............... 330/142; 330/302; 330/296; 333/214

(58) Field of Classification Search ............ 330/302, 330/296, 142; 333/214
See application file for complete search history.

(56) References Cited

U.S. PATENT DOCUMENTS

| | | | | |
|---|---|---|---|---|
| 4,875,019 | A * | 10/1989 | Monson et al. | 330/302 |
| 5,742,205 | A * | 4/1998 | Cowen et al. | 330/269 |
| 6,313,706 | B1 * | 11/2001 | Kakuta et al. | 330/302 |
| 6,628,176 | B1 * | 9/2003 | Okada | 333/32 |
| 6,963,247 | B2 * | 11/2005 | Sivonen et al. | 330/302 |
| 7,084,707 | B2 * | 8/2006 | Razavi et al. | 330/302 |

FOREIGN PATENT DOCUMENTS

| | | |
|---|---|---|
| JP | 2002-171140 | 6/2002 |
| KR | 2002-0066038 | 8/2002 |

\* cited by examiner

*Primary Examiner*—Patricia Nguyen
(74) *Attorney, Agent, or Firm*—J.C. Patents

(57) ABSTRACT

The present invention relates to an input and output signal preservation circuit of an amplification circuit capable of preventing an attenuation of an input signal and an output signal of an amplification circuit in such a manner that an AC input signal is amplified using an amplification device such as a vacuum tube or a transistor in a preamplifier.

5 Claims, 9 Drawing Sheets

| Frequency(f) | Voltage(V1) | Voltage(V) | Resistor(R1) |
|---|---|---|---|
| 20 Hz | 3.6 V | 2.4 V | 270 KΩ |
| 100 Hz | 3.6 V | 2.4 V | 270 KΩ |
| 3 KHz | 3.6 V | 2.4 V | 270 KΩ |
| 10 KHz | 4 V | 2 V | 270 KΩ |
| 15 KHz | 4.2 V | 1.8 V | 270 KΩ |
| 20 KHz | 4.4 V | 1.6 V | 270 KΩ |

| Frequency(f) | Voltage(V1) | Voltage(V) | AC resistance(L1) |
|---|---|---|---|
| 20 Hz | 0 V | 6 V | 628 Ω |
| 100 Hz | 0.4 V | 5.6 V | 3.14 KΩ |
| 3 KHz | 1.4 V | 4.6 V | 94.2 KΩ |
| 10 KHz | 2.4 V | 3.6 V | 341 KΩ |
| 15 KHz | 2 V | 4 V | 471 KΩ |
| 20 KHz | 2 V | 4 V | 628 KΩ |

| Frequency(f) | Voltage(V1) | Voltage(V) | AC resistance(L1) |
|---|---|---|---|
| 20 Hz | 2.4 V | 270 KΩ | 628 Ω |
| 100 Hz | 2.4 V | 270 KΩ | 3.14 KΩ |
| 3 KHz | 2.4 V | 270 KΩ | 94.2 KΩ |
| 10 KHz | 1.6 V | 270 KΩ | 341 KΩ |
| 15 KHz | 1.6 V | 270 KΩ | 471 KΩ |
| 20 KHz | 1.2 V | 270 KΩ | 628 KΩ |

| Frequency(f) | Voltage(V1) | Voltage(V) | AC resistance(L1) |
|---|---|---|---|
| 20 Hz | 6 V | 0 V | 628 Ω |
| 100 Hz | 5.8 V | 0.2 V | 3.14 KΩ |
| 3 KHz | 4.4 V | 1.6 V | 94.2 KΩ |
| 10 KHz | 4.6 V | 1.4 V | 341 KΩ |
| 15 KHz | 5.2 V | 0.8 V | 471 KΩ |
| 20 KHz | 5.2 V | 0.8 V | 628 KΩ |

US 7,511,573 B2

INPUT/OUTPUT SIGNALS PRESERVER CIRCUIT OF AMPLIFICATION CIRCUITS

TECHNICAL FIELD

The present invention relates to an input and output signal preservation circuit of an amplification circuit, and in particular to an input and output signal preservation circuit of an amplification circuit capable of preventing an attenuation of an input signal and an output signal of an amplification circuit in such a manner that an AC input signal is amplified using an amplification device such as a vacuum tube or a transistor in a preamplifier.

BACKGROUND ART

FIG. 1 is a view of a small signal amplification circuit using a vacuum tube T1 as an amplification device wherein the vacuum tube T1 has been generally used for various audio systems. Here, the vacuum tube T1 can be substituted with a transistor.

As shown in FIG. 1, in the vacuum tube T1 of the amplification circuit, a self-bias unit 10 is connected in the vacuum tube T1 wherein a bias resistor R1 is connected with a grid in parallel and has a resistor R2 and a condenser C1 that are connected with a cathode in parallel. The self-bias unit 10 amplifies an AC input signal inputted into the grid and outputs to a plate.

The power unit 20 of the amplification circuit includes a smoothing unit 21 formed of a power transformer PT1, a rectifier T5, a resistor R4, and charging and discharging condensers C2 and C5 wherein the above elements are coupled in the shape of π. The 220V input AC power is converted into a DC power (B+) by the power transformer PT1. The DC power (B+) rectified and smoothed through the rectifier T5 and the smoothing unit 21 is supplied to the plate through the load resistor R3 connected in parallel with the plate of the vacuum tube T1.

The coupling condenser C4 of the amplification circuit is connected with the plate output terminal of the vacuum tube T1 for thereby disconnecting the DC component of the amplification output signal Vo1.

In the thusly constituted amplification circuit, when the DC power (B+) is supplied to the plate signal that is the positive terminal of the vacuum tube T1, the grid bias is generated at the resistor R2 of the self-bias unit 10 connected with the cathode that is the negative terminal of the vacuum tube T1 and the bias resistor R1 connected with the grid of the vacuum tube T1, respectively. Therefore, the vacuum tube T1 amplifies the AC input signal Vi1 inputted into the grid and outputs to the plate.

However, in the amplification circuit generally used in various audio systems, the effective resistance values are changed due to the capacity between both terminals of the bias resistor R1, so that the AC input signal Vi1 could be leaked through the bias resistor R1. As a result, the grid input signal of the vacuum tube T1 that is the amplification device could be attenuated.

In the case that the resistance value of the bias resistor R1 is set larger than over a few values of MΩ in order to prevent the leakage of the AC input signal Vi1 through the bias resistor R1, the grid bias voltage Vg occurring by the bias resistor R1 is sharply increased. Therefore, the grid input current of the vacuum tube T1 is increased and is excessively oscillated, so that the vacuum tube T1 is broken.

Therefore, the conventional amplification circuit should adapt the bias resistor R1 having a resistance value lower enough for thereby preventing the damage of the vacuum tube T1 that has been used as an amplification device. In this case, it is impossible to prevent the leakage of the AC input signal Vi1.

In the above amplification circuit, since the effective resistance value is changed due to the capacity between both ends of the load resistor R3 of the output terminal, the amplification output signal Vo1 may be leaked through the resistor R3. As a result, the plate output signal of the vacuum tube T1 that is the amplification device could be attenuated.

In particular, in the above amplification circuit, since the capacity of the coupling condenser C4 of the output terminal is set lower than the capacity of the charging and discharging condensers C2 and C5 included in the smoothing unit 21 of the power unit 20, the amplification output signal Vo1 is leaked through the charging and discharging condensers C2 and C5 of the smoothing unit 21. As a result, the plate output signal of the vacuum tube T1 that is the amplification device is attenuated.

In addition, in the above amplification circuit, the non-rectification AC component occurring due to the charging and discharging operations of the charging and discharging condensers C2 and C5 included in the smoothing unit 21 of the power unit 20 is mixed with the input and output signals Vi1 and Vo1, noises could be included in the input and output signals Vi1 and Vo1

DISCLOSURE OF INVENTION

Accordingly, it is an object of the present invention to overcome the above-described problems encountered in the conventional art.

It is another object of the present invention to provide an input and output signal preservation circuit of an amplification circuit capable of increasing an input resistance value with respect to an AC input signal by connecting an input signal preservation electric device with an input terminal of an amplification circuit and increasing an output resistance value with respect to an amplification output signal by connecting an output signal preservation electric device with an output terminal of the amplification circuit, for thereby preventing an attenuation of an input signal and an output signal, respectively.

To achieve the above objects, in an amplification circuit using amplifying devices in a pre-amplifier in an audio system, there is provided an input and output signal preservation circuit of an amplification circuit, comprising an input signal preservation unit that is connected with an input terminal of an amplification device of an amplification circuit capable of amplifying an AC input signal using a certain amplification device and outputting the same and increases an input resistance value with respect to the input signal and prevents an attenuation of the input signal; and an output signal preservation unit that is connived with an output terminal of the amplification device and increases an output resistance value with respect to the amplification signal and prevents an attenuation of the amplification output signal for thereby compensating a voltage variation ratio with respect to the amplification output signal.

BRIEF DESCRIPTION OF DRAWINGS

The preferred embodiments of the present invention will be described with reference to the accompanying drawings.

BEST MODE FOR CARRYING OUT THE INVENTION

The first embodiment of the present invention will be described with reference to the accompanying drawings.

Figure 1:
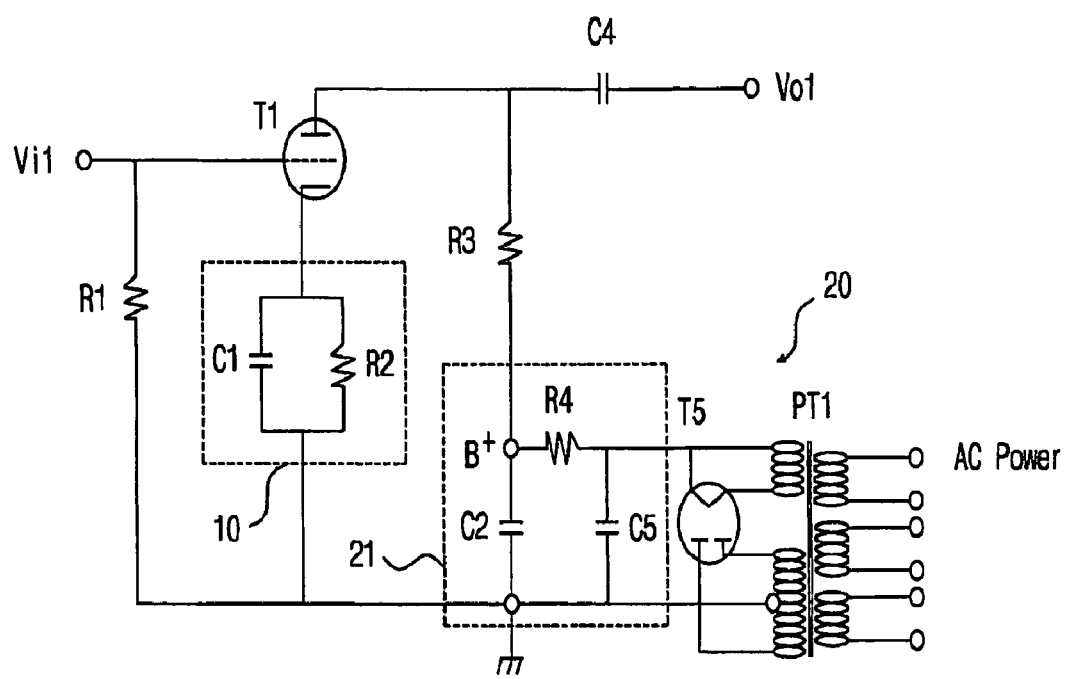
FIG. 1 is a view illustrating the construction of a conventional small signal amplification circuit.
Figure 2A:
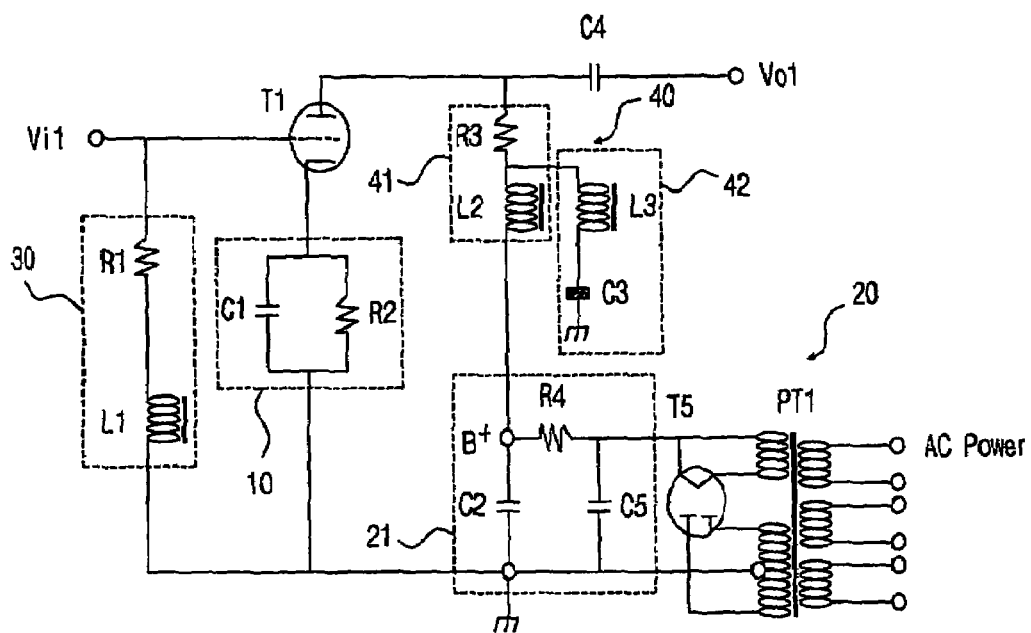
FIG. 2A is a view illustrating the construction of a small signal amplification circuit adapting an input and output signal preservation circuit according to the present invention.

FIG. 2A is a view of a state that an input and output signal preservation circuit according to the present invention is adapted to a small signal amplification circuit of FIG. 1 adapting a vacuum tube T1 as an amplification device, wherein the vacuum tube has been used in various conventional audio systems as a pre-amplifier. Here, the vacuum tube T1 can be substituted with a transistor. The power unit 20 including the smoothing unit 21 of FIG. 1 may be directly adapted. Therefore, the same reference numerals are given, and the descriptions of the same will be omitted.

As shown in FIG. 2A, the input and output signal preservation circuit of the amplification circuit according to the present invention includes an input signal preservation unit 30 and an output signal preservation unit 40. The inventor of the present invention calls this circuit a 5A circuit or an Artist circuit and wants to indicate the same as AAAA.

The input signal preservation unit 30 includes a bias resistor R1 and a reactor L1 and is connected with an input terminal of the vacuum tube T1 of the amplification circuit for thereby preventing the attenuation of the input signal by increasing the input resistance value with respect to the AC input signal Vi1.

The inventor of the present invention calls the input signal preservation unit 30 formed of the bias resistor R1 and the reactor L1 as a 5A1 circuit.

The bias resistor R1 is connected with the grid input terminal of the vacuum tube T1 in parallel.

The reactor L1 operates as an AC resistor with respect to the AC input signal Vi1 and is connected with the bias resistor R1 in series for thereby preventing a leakage of the AC input signal Vi1 by increasing the input resistance value.

The output signal preservation unit 40 includes an amplification signal preservation unit 41 formed of a load resistor R3 and a first reactor L2, and a voltage compensation unit 42 formed of a second reactor L3 and a condenser C3 and is connected with the output terminal of the vacuum tube T1 of the amplification circuit for thereby preventing an attenuation of the amplification output signal Vo1 by increasing the output resistance value with respect to the amplification output signal Vo1 and compensating the voltage variation degree with respect to the amplification output signal Vo1.

The inventor of the present invention calls the output signal preservation unit 40 formed of the amplification signal preservation unit 41 and the voltage compensation unit 42 as a 5A2 circuit.

The load resistor R3 of the amplification signal preservation unit 41 is connected with the plate output terminal of the vacuum tube T1 in parallel.

The first reactor L2 of the amplification signal preservation unit 41 is connected with the load resistor R3 in series and operates as an AC resistor with respect to the amplification output signal Vo1 for thereby preventing a leakage of the amplification output signal by increasing the output resistance value together with the load resistor R3.

The second reactor L3 of the voltage compensation unit 42 is connected with a connection point of the load resistor R3 and the first reactor L2 in parallel and operates as an AC resistor with respect to the amplification output signal Vo1 for thereby preventing a leakage of the amplification output signal Vo1 by increasing the output resistance value together with the load resistor R3.

The condenser C3 of the voltage compensation unit 42 is connected with the second reactor L3 in series and compensates the voltage variation ratio of the amplification output signal.

The operation of the input and output signal preservation circuit according to the present invention adapted to the small signal amplification circuit used in various conventional audio systems as a pro-amplifier will be described with reference to the accompanying drawings.

The amplification circuit of FIG. 2A operates identically to the amplification circuit of FIG. 1. Actually, when a specific DC power (B+) is supplied to the plate side that is an anode of the vacuum terminal T1, a grid bias is formed at the resistor R2 of the self-bias unit 10 connected with the cathode that is a cathode of the vacuum tube T1 and a bias resistor R1 connected with a grid side of the vacuum tube T1 by the condenser C1, and the vacuum tube T1 amplifies the AC input signal Vi1 inputted into the grid and outputs to the plate.

At this time, the reactor L1 connected in series with the bias resistor R1 is of the input signal preservation unit 30 operates as an AC resistor with respect to the AC input signal Vi1 for thereby preventing a leakage of the AC input signal Vi1 by increasing the input resistance value together with the bias resistor R1.

Actually, the operation that the reactor L1 connected in series with the bias resistor R1 of the input signal preservation unit 30 increases the input resistance value with respect to the AC input signal Vi1 will be described with reference to FIGS. 2B through 2E.

Figure 2B:
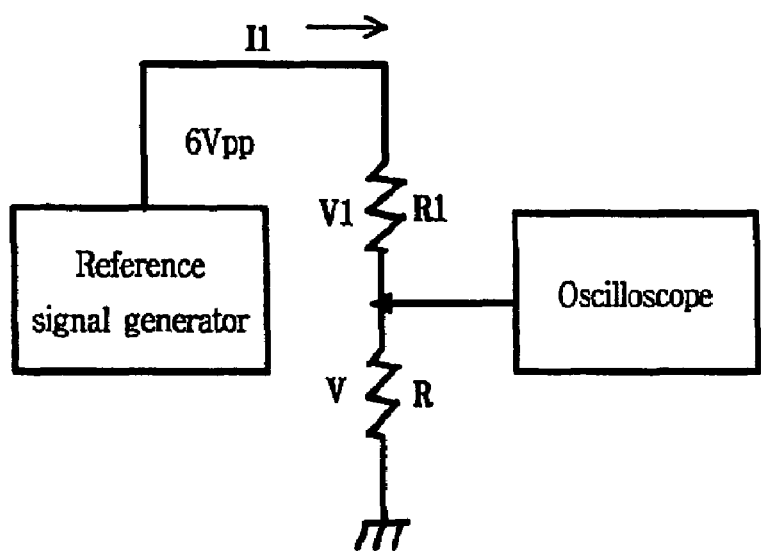
FIG. 2B is a view of a resistance value variation characteristic measurement circuit and a characteristic table with respect to an AC input signal of a bias resistance.

FIG. 2B is a view of a resistance variation characteristic measurement circuit and a characteristic table with respect to the AC input signal of the bias resistor R1. As shown therein, the resistance values of the bias resistor R1 and the reference resistor R for measuring the resistance value variation of the bias resistor R1 are identically set to 270 kΩ.

As shown in FIG. 2B, when the AC input signal of which the amplitude is 6Vpp and the current is I1 is inputted from the reference signal generator, assuming that the frequency of the AC input signal is f=0 Hz, the results are V1+V=6Vpp, and I1=6V/(R1+R)=6V/(270 kΩ+270 kΩ)=11.1 µA.

However, the voltage measurement values of the bias resistor R1 measured by the oscilloscope and the reference resistor R have the amplitude variations of 3.6V~4.4V or 2.6V~1.6V with respect the frequency of 20 Hz~20 kHz of the AC input signal. Therefore, the bias resistor R1 has an effective resistance value changing with respect to the frequency change.

Therefore, as shown in FIG. 2A, the bias resistor R1 of the grid input terminal of the vacuum tube T1 has an effective resistance value changing with respect to the frequency of the AC input signal Vi1. Therefore, it is needed to use the minimum value DC bias for the reasons that the grid current may be sharply increased by the DC bias voltage, and the vacuum tube T1 may be damaged when the resistance value of the bias resistor R1 is set with over a few MΩ in order to preserve the grid input signal.

In addition, even when the resistance value of the bias resistor R1 is set with a minimum value in consideration with the change in the resistance value with respect to the AC input signal Vi1, the minimum set resistance value has a changing effective resistance value, and the changed value affects the DC grid current to be increased, so that the vacuum tube T1 may be damaged. Therefore, it is needed to set the resistance value to be lower than the above value. As the user of the bias resistor R1 having a low resistance value is used, the high frequency characteristic signal having a lower voltage of the AC input signal Vi1 or the ultra lower frequency and ultra harmonics disappear through the lower bias resistor R1 before they are inputted into the grids and are not inputted into the grids of the vacuum tube T1, so that the signal amplification does not occur in the high frequency characteristic signal or the ultra lower frequency and the ultra harmonics of the AC input signal Vi1.

Since the resistance value of the bias resistor R1 having a physical characteristic is changed by the frequency change of the AC input signal, as the frequency is increased based on f=1/T of the relationship between the frequency and the period, the time T is decreased, and the physical characteristic is changed based on the change (ΔT) of the time. Therefore, the physical degree does not exist with respect to a very short time period, and the space is changed (ΔS). When the variation ΔT of the time is extended to the time dT, and the variation ΔS of the space is extended to dS, the variation dT of the time causes the variation dS of the space. The inventor of the present invention calls the above principle a time space deviation principle) in the descriptions of the present invention.

As shown in the characteristic table of FIG. 2b, what the voltage of both ends of the measurement reference resistor R is changed is the same as what the voltage of both ends of the bias resistor R1 is changed based on the circuit characteristic. Therefore, there is shown that the resistance value of the bias resistor R1 of the measurement circuit using the same resistance value as the reference resistor R is changed. As shown in FIG. 2B, there is shown a variation state of the effective resistance value of the bias resistor. The effects by the error of the measurement meter will be neglected.

Figure 2C:
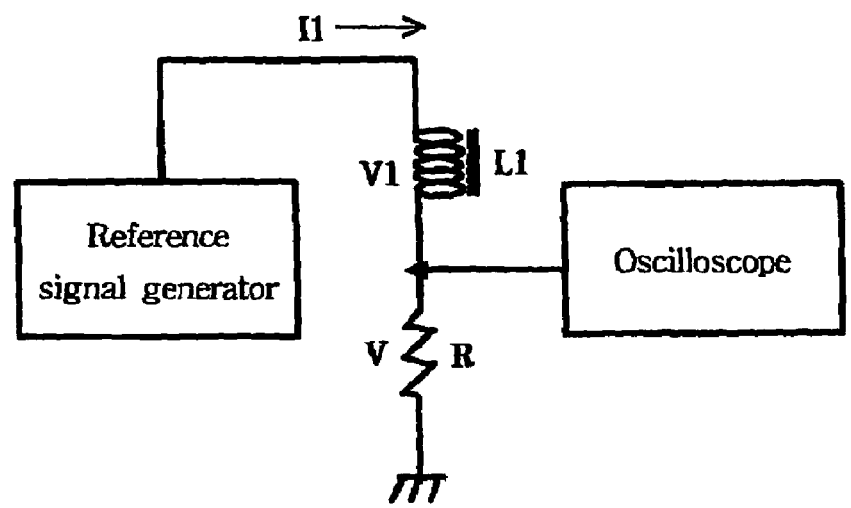
FIG. 2C is a view of an AC resistance value variation characteristic measurement circuit and a characteristic table with respect to an AC input signal of a reactor.

FIG. 2C is a view of an AC resistance value variation characteristic measurement circuit with respect to the AC input signal of the reactor. As shown therein, there are a 5 H reactor L1, and a 250 kΩ reference resistor R for the AC resistance value variation measurement of the reactor L1.

As shown in FIG. 2C, when the AC input signal of which the amplitude is 6Vpp, and the current is I1 is inputted from the reference signal generator, the AC resistance of the reactor L1 is $Z_L=\omega L=2\pi$ fL=2*3.14*5*f[Ω] with respect to the frequency of the AC input signal. As the frequency of the AC input signal is increased, the AC resistance $Z_L$ of the reactor L1 is flexibly increased.

Actually, the voltage measurement values of the reactor L1 and the reference resistor R measured by the oscilloscope has amplitude variations of 0V~2V or 6V~4V with respect to the frequency 20 Hz~20 kHz of the AC input signal. Therefore, it is known that the reactor L1 has an AC resistance value changing to 2πfL with respect to the frequency variation.

For example, as shown in the characteristic table of FIG. 2C, the AC resistance value is 628Ω at the low band of 20 Hz, and this value could be considered to be approximate to 0Ω. There is not any voltage drop (V1=0V) by the reactor L1, and the whole voltage is 6V at both end of the reference resistor R. In addition, since the voltage drop (V1) of 2V corresponding to the AC resistor of occurs ωL=2π fL at both ends of the reactor L1 occurs at the high band of 20 Hz, so that it is known that the voltage drop of 4V occurs at both ends of the reference resistor R.

Figure 2D:
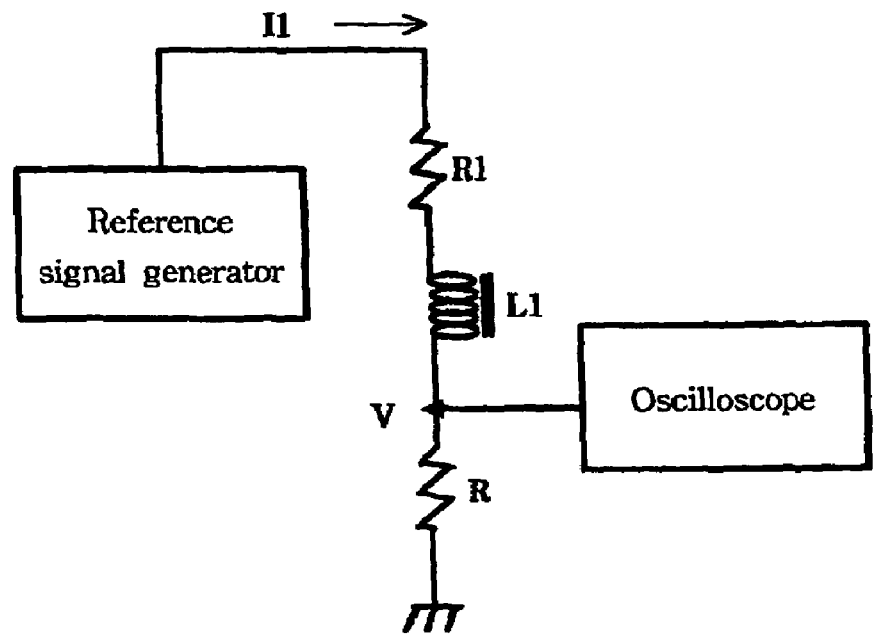
FIG. 2D is a view of an input resistance value variation characteristic measurement circuit and a characteristic table with respect to an AC input signal of an input signal preservation unit according to the present invention.

FIG. 2D is a view of an input resistance value variation characteristic measurement circuit and a characteristic table with respect to the AC input signal of the input signal preservation unit. As shown therein, there are provided a 270 kΩ bias resistor R1, a 5 H reactor L1, and a 270 kΩ reference resistor R for the input resistance value variation measurement of the bias resistor R1 and the reactor L1.

As shown in FIG. 2d, when the AC input signal of which the amplitude is 6Vpp and the current is I1 is inputted from the reference signal generator, the AC resistance $Z_L$ of the reactor L1 is $Z_L=\omega L=2\pi$ fL=2*3.14*5*f[Ω]. As the frequency of the AC input signal is increased, the AC resistance $Z_L$ of the reactor L1 is flexibly largely increased as shown in FIG. 2C.

Figure 2E:
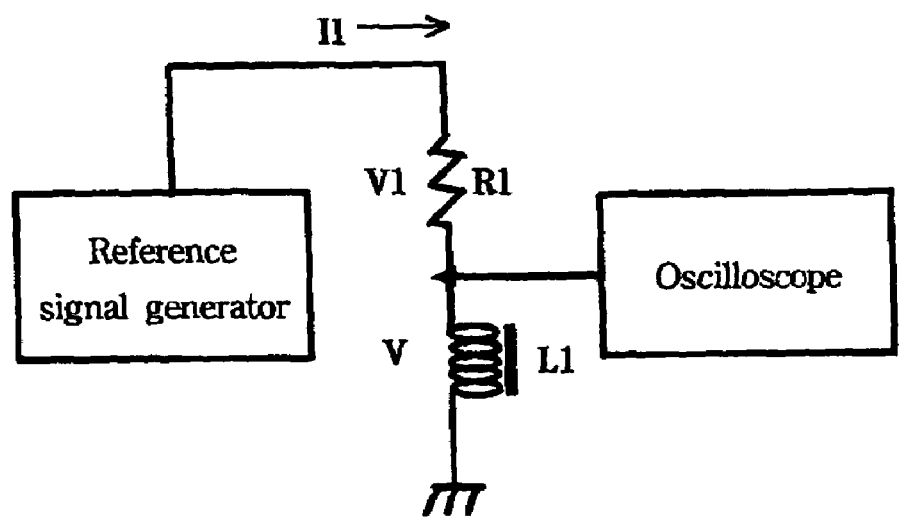
FIG. 2E is a view of another input resistance value variation characteristic measurement circuit and a characteristic table with respect to an AC input signal of an input signal preservation unit.

FIG. 2E is a view of another input resistance value variation characteristic measurement circuit and a characteristic table with respect to an AC input signal of the input signal preservation unit. There are shown a 270 kΩ bias resistor R1 and a 5 H reactor L1.

As shown in FIG. 2E, when the AC input signal of which the amplitude is 6Vpp and the current is I1 is inputted from the reference signal generator, the AC resistance $Z_L$ of the reactor L1 is $Z_L=\omega L=2\pi$ fL=2*3.14*5*f [Ω]. As the frequency of the AC input signal is increased, the AC resistance $Z_L$ of the reactor L1 is flexibly largely increased as shown in FIG. 2C.

As shown in FIGS. 2B through 2E, the effective resistance values are changed based on the voltage variation at both ends of the resistor in connection with the frequency change of the AC input signal of FIG. 2B. The possible minimum resistance value is used like in the measurement circuit and a characteristic table of FIG. 2E. In this embodiment, it is known that the voltage drop at both ends of the resistor is decreased based on the frequency increase of the AC input signal even when the grid bias current is minimized in the vacuum tube T1 of FIG. 2A. Even when the frequency attenuation of the AC input signal is large at the bias resistor R1, it is possible to use the resistance value smaller than the minimum resistance value with respect to the bias resistor R1 in such a manner that the basic circuit is configured by connecting in series the reactor L1 to the bias resistor R1 and adding the input signal preservation unit 30 that the AC resistor ($Z_L$) of the reactor L1 is added based on the increase of the frequency of the AC input signal.

In particular, in the basic principle of the input signal preservation unit 30, the grid input circuit of the vacuum tube T1 of FIG. 2A is configured in such a manner that the audible frequency bands of 250 Hz, 3 kHz, 4 kHz, 5 kHz, 9 kHz and harmonics that are too sensitive with respect to the high degree sound source protect the frequency characteristics of the sub-harmonic and ultra sub-harmonic and the ultra harmonic are protected. The series resonance is achieved at over 90 kHz. There is provided a bias resistor R1 of which the AC resistor ($Z_L$) of the reactor L1.

Meanwhile, when the vacuum tube T1 amplifies the AC input signal Vi1 inputted into the grid and outputs to the plate, the amplification output signal Vo1 disconnects the DC component by the coupling condenser C4.

At this time, the amplification signal preservation unit 41 formed the load resistor R3 and the first reactor L2 of the output signal preservation unit 40 operate in the same principle as the input signal preservation unit 30 and increases the output resistance value with respect to the amplification output signal Vo1 at the output terminal of the vacuum tube T1 of the amplification circuit for thereby preventing the attenuation of the amplification output signal Vo1.

The second reactor L3 of the output signal preservation unit 40 and the second reactor L3 of the voltage compensation unit 42 formed of the condenser C3 operate in the same principle as the reactor L1 of the input signal preservation unit 30 and the first reactor L2 of the output signal preservation unit 40. The output resistance value with respect to the amplification output signal Vo1 is increased at the output terminal of the vacuum tube T1 of the amplification circuit for thereby preventing the attenuation of the amplification output signal Vo1.

In particular, the condenser C3 of the voltage compensation unit 42 compensates the voltage variation ratio with respect to the amplification output signal Vo1 based on the charging and discharging operations of the charging and discharging condensers C2 and C5 included in the smoothing unit 21 of the power unit 20 for thereby stabilizing the bias voltage of the vacuum tube T1.

The second embodiment of the present invention will be described with reference to FIG. 3.

Figure 3:
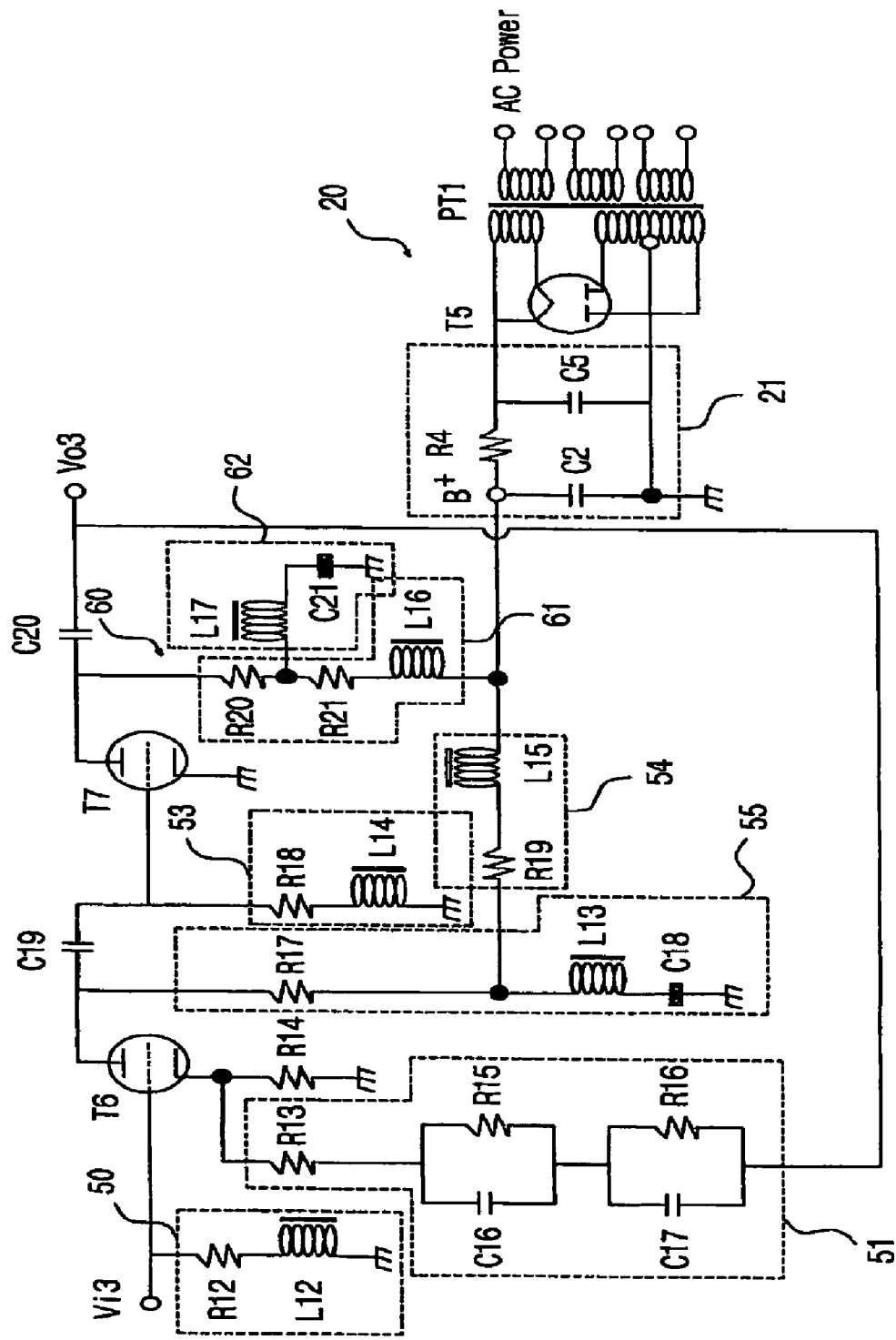
FIG. 3 is a view illustrating the construction of a turntable phono-equalizer small signal amplification circuit adapting an input and output signal preservation circuit according an embodiment of the present invention.

FIG. 3 is a view illustrating the construction that the input and output signal preservation circuit according to the present invention is adapted to the conventional phono equalizer small signal amplification circuit for the turntable in which two vacuum tubes T6 and T7 are adapted as a two-stage amplification device. Here, the vacuum tubes T6 and T7 can be substituted with the transistors.

As shown in FIG. 3, the input and output signal preservation circuit according to the present invention includes an input signal preservation unit 50 that is formed of a bias resistor R12 and a reactor L12 and is connected with an input terminal of the first stage amplification vacuum tube T6, a voltage compensation unit 55 that is formed of a load resistor R17, a second reactor L13 and a condenser C18 and is connected with an output terminal of the first stage amplification vacuum tube T6, an input signal preservation unit 53 that is formed of a bias resistor R18 and a reactor L14 and is connected with an input terminal of the second stage amplification vacuum tube T7, and an output signal preservation unit 60 that is formed of two load resistors R20 and R21, a first reactor L16, a second reactor L17 and a condenser C21. The output signal preservation unit 60 is connected with an outer terminal of the second stage amplification tube T7.

There is further provided an amplification signal preservation unit 54 between the first stage amplification circuit and the second stage amplification circuit, namely between the voltage compensation unit 55 and the output signal preservation unit 60 wherein it is formed of the load resistor R19 and the first reactor L15 for compensating the voltage variation ratio with respect to the amplification output signal based on the amplification operation of the first stage amplification circuit and the second stage amplification circuit for thereby stabilizing the bias voltage of two vacuum tubes T6 and T7.

A self-bias resistor R14 is connected with a cathode of the first stage amplification vacuum tube T6. A time constant compensation unit 51 is formed of a series-connected resistor R13, a plurality of condensers C16 and C17 and resistors R15 and R16 for thereby compensating the time constant number of the AC input signal Vi3 and is connected with the self-bias resistor R14.

The power unit 20 including the smoothing unit 21 of FIGS. 1 and 2A is directly adapted. Therefore, the same reference numerals are adapted, and the descriptions of the same will be omitted.

The operation of the input and output signal preservation circuit according to the present invention adapted to a conventional turntable phono-equalizer small signal amplification circuit will be described.

When a certain DC power (B+) of the power unit 20 is supplied to the plate side that is an anode terminal of the first stage amplification vacuum tube T6, a grid bias of which a time constant is compensated by the time constant compensation unit 51 is formed at the bias resistor R12 connected with the grid side of the first stage amplification vacuum tube T6 by the self-bias resistor R14 connected with the cathode that is a cathode of the first stage amplification vacuum tube T6. Therefore, the first stage amplification vacuum tube T6 amplifies the AC input signal Vi3 inputted into the grid and outputs to the plate.

At this time, the reactor L12 connected in series with the bias resistor R12 of the input signal preservation unit 50 operates as an AC resistor with respect to the AC input signal Vi3 and includes the input resistance value together with the bias resistor R12 for thereby preventing a leakage of the AC input signal Vi3.

The output signal amplified by the first stage amplification vacuum tube T6 disconnects the DC component by the coupling condenser C19 and is inputted into the grid of the second stage amplification vacuum tube T7.

At this time, the load resistor R17 and the second reactor L13 of the voltage compensation unit 55 operate in the same principle as the input signal preservation unit 30 as shown in FIG. 2A and increases the output resistance value with respect to the amplification output signal at the output terminal of the vacuum tube T6 of the first stage amplification circuit and prevents the attenuation of the amplification output signal. The condenser C18 of the voltage compensation unit 55 compensates the voltage variation ratio with respect to the amplification output signal based on the charging and discharging operations of the charging and discharging condensers C2 and C5 included in the smoothing unit 21 of the power unit 20 for thereby stabilizing the bias voltage of the first stage amplification vacuum tube T6.

The reactor L14 connected in series with the bias resistor R18 of the input signal preservation unit 53 of the second stage amplification vacuum tube T7 operates as the AC resistor with respect to the first amplified AC input signal and increases the input resistance value together with the bias resistor R18 for thereby preventing a leakage of the first stage amplified AC input signal.

As the first stage amplified AC input signal is inputted into the grid of the second stage amplification vacuum tube T7, the second stage amplification vacuum tube T7 second-stage amplifies the AC input signal and outputs to the plate, and the amplification output signal Vo3 disconnects the DC component based on the coupling condenser C20.

At this time, the amplification signal preservation unit 61 formed of two load resistors R20 and R21 of the output signal preservation unit 60 and the first reactor L16 operates in the same principle as the input signal preservation unit 30 of FIG. 2A and increases the output resistance value with respect to the amplification output signal Vo3 at the output terminal of the vacuum tube T7 of the second stage amplification circuit for thereby preventing the attenuation of the amplification output signal Vo3.

In addition, the second reactor L17 of the output signal preservation unit 60 and the second reactor L17 of the voltage compensation unit 62 formed of the condenser C21 operate in the same principle as the reactor L1 of the input signal preservation unit 30 of FIG. 2A and the first reactor L2 of the output signal preservation unit 40 and increases the output resistance value with respect to the amplification signal Vo3 at the output terminal of the vacuum tube T7 of the second stage amplification circuit for thereby preventing the attenuation of the amplification output signal Vo3.

In particular, the condenser C21 of the voltage compensation unit 62 compensates the voltage variation ratio with respect to the amplification output signal Vo3 based on the charging and discharging operations of the charging and discharging condensers C2 and C5 included in the smoothing unit 21 of the power unit 20 for thereby stabilizing the bias voltage of the second stage amplification vacuum tube T7.

The third embodiment of the present invention will be described with reference to the accompanying drawings.

Figure 4:
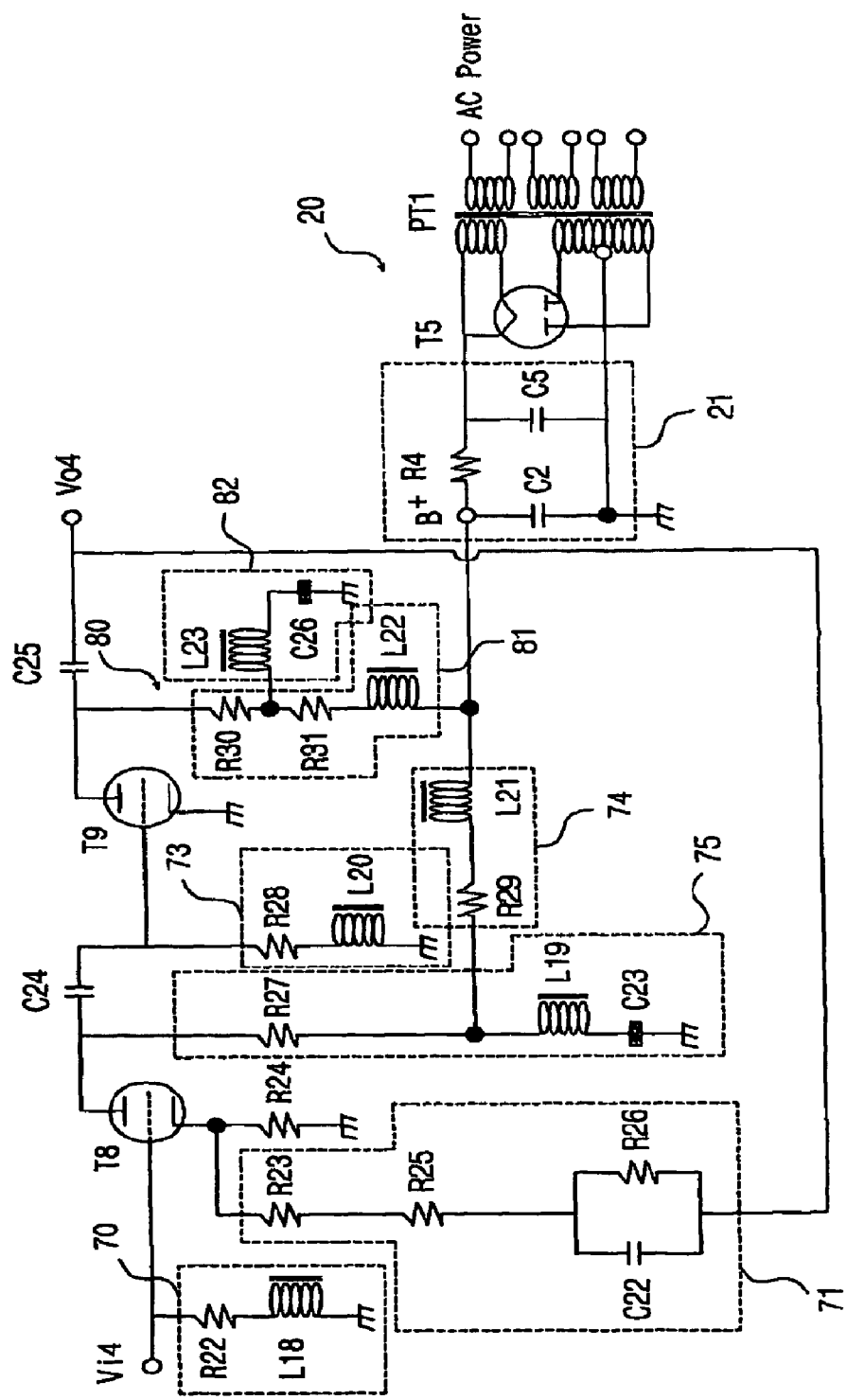
FIG. 4 is a view illustrating the construction of a tape equalizer small signal amplification circuit adapting an input and output signal preservation circuit according to another embodiment of the present invention.

FIG. 4 is a view illustrating the construction that the input and output signal preservation circuit according to the present invention is adapted to the conventional tape equalizer small signal ampification circuit that uses two vacuum tubes T8 and T9 as the second stage amplification device.

Here, the vacuum tubes T7 and T8 can be substituted with the transistor.

In particular, FIG. 4 is a circuit diagram illustrating the construction that the input and output signal preservation circuit according to the present invention is adapted to the conventional turntable phono-equalizer small signal amplification circuit using the second stage amplification device. There is a difference between the above embodiment and the second embodiment of FIG. 3. Namely, in this embodiment of the present invention, the time constant compensation unit 71 connected in parallel with the self-bias resistor R24 connected with the cathode of the first stage amplification vacuum tube T8 is formed of a plurality of resistors R23 and R25 connected in parallel or series, and a plurality of condensers C22 and C26 for thereby compensating the time constant of the AC input signal Vi4.

The remaining constructions are the same as the second embodiment of FIG. 3, so that the construction and operation will be omitted.

The fourth embodiment of the present invention will be described with reference to FIG. 5.

Figure 5:
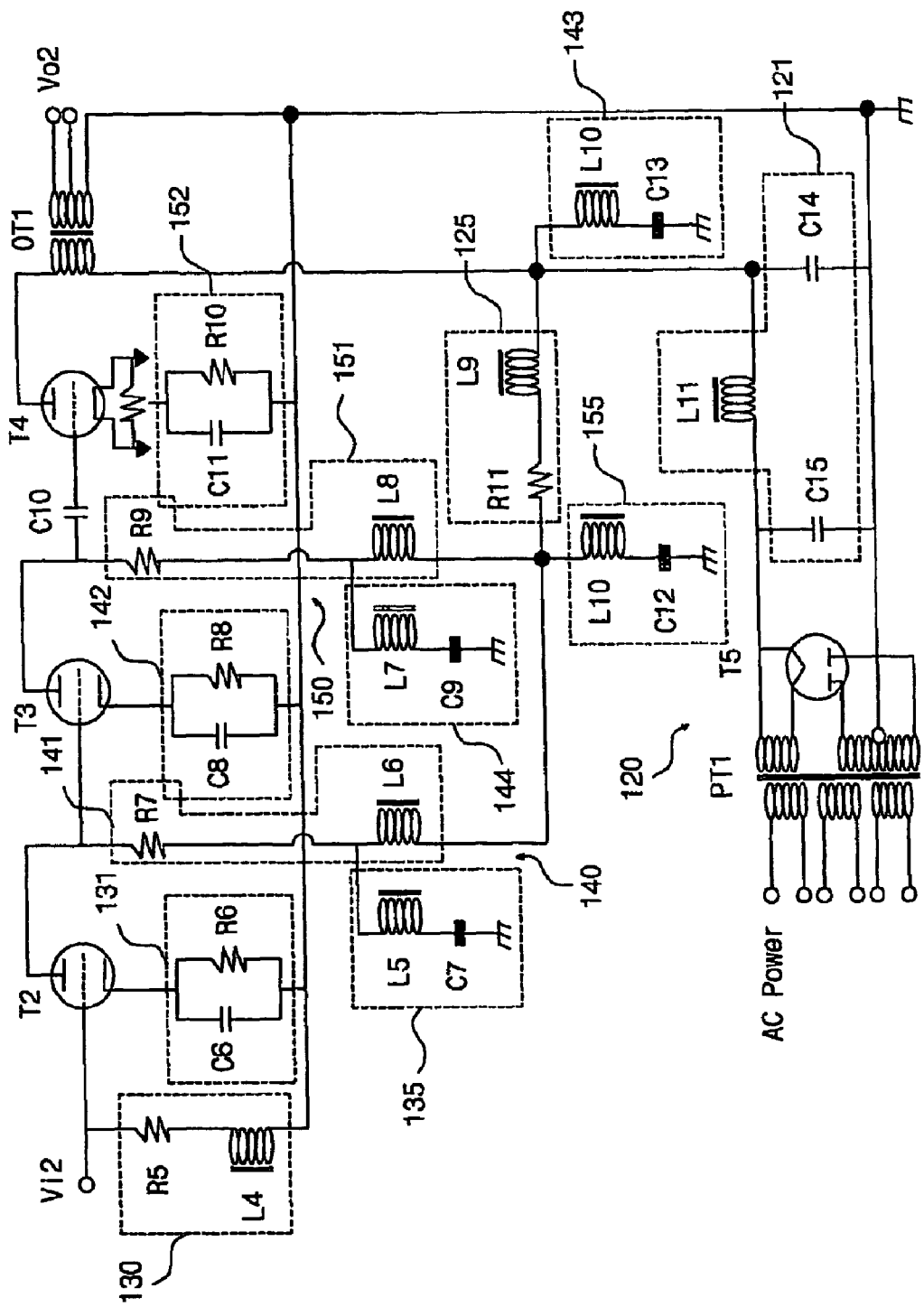
FIG. 5 is a view illustrating the construction of a power amplification circuit adapting an input and output signal preservation circuit according to another embodiment of the present invention.

FIG. 5 is a view illustrating a state that the input and output signal preservation circuit according to the present invention is adapted to the conventional power amplification circuit capable of outputting an amplification output signal Vo2 through the output transformer OT1 using the three stage amplification device with respect to three vacuum tubes T2, T3 and T4 driven by the DC power supplied through the smoothing unit 121 in which the reactor L11 and the charging and discharging condensers C15 and C14 are coupled in a shape of π. Here, the vacuum tubes T2, T3 and T4 may be substituted with the transistor.

As shown in FIG. 5, the input and output signal preservation circuit according to the present invention includes a first stage output signal preservation unit 140, a second stage output signal preservation unit 150, and the voltage compensation unit 143. The first stage output signal preservation unit 140 includes an input signal preservation unit 130 formed of a bias resistor R5 and a reactor L4 and connected with an input terminal of the first stage amplification vacuum tube T2, an amplification signal preservation unit 141 formed of a load resistor R7 and a first reactor L6 and connected with an output terminal of the first stage amplification vacuum tube T2 and an input terminal of the second stage amplification vacuum tube T3, and a voltage compensation unit 135 formed of a second reactor L5 and a condenser C7 and connected in parallel with the amplification signal preservation unit 141.

The second stage output signal preservation unit 150 includes an amplification signal preservation unit 152 formed of a load resistor R9 and a first reactor L8 and connected with an output terminal of the second stage amplification vacuum tube T3 and an input terminal of the third stage amplification vacuum tube T4, and a voltage compensation unit 144 formed of a second reactor L7 and a condenser C9 and connected in parallel with the amplification signal preservation unit 150.

The voltage compensation unit 143 is formed of a second reactor L10 and a condenser C13 and is connected with a primary side of the output transformer OT1 connected with an output terminal of the third stage amplification vacuum tube T4.

The self-bias units 131, 142 and 152 are connected with the cathodes of the first, second and third amplification vacuum tubes T2, T3 and T4 and are formed of the resistors and condensers R6, C6; R8, C8 and R10, C11, so that a grid bias is formed at the bias resistor R5 connected with a grid side of the first stage amplification vacuum tube T2.

The voltage compensation unit 155 is further connected at a connection point between the first stage amplification circuit and an output terminal of the third stage amplification circuit, namely, at a rear end of the amplification signal preservation unit 141 of the first stage output signal preservation unit 140 and at a connection point of the amplification signal preservation unit 151 of the second stage output signal preservation unit 150 for thereby compensating the voltage variation ratio with respect to the amplification output signal based on the amplification operation of the first amplification circuit and the second amplification circuit for thereby stabilizing the bias voltages of two vacuum tubes T2 and T3.

The amplification signal preservation unit 125 is further connected between the second stage amplification circuit and an output terminal of the third stage amplification circuit, namely, between the amplification signal preservation unit 151 of the second stage output signal preservation unit 150 and the voltage compensation unit 155 connected with an output terminal of the third stage amplification vacuum tube T4 and is formed of a load resistor R11 and a first reactor L9 for thereby compensating the voltage variation ratio with respect to the amplification output signal based on the amplification operation of the second stage amplification circuit and the third amplification circuit and stabilizing the bias voltages of two vacuum tubes T3 and T4.

The power unit 120 of the amplification circuit includes a smoothing unit 121 in which a power transformer PT1, a rectifier T5, a reactor L11, and charging and discharging condensers C14 and C15 are coupled in a shape of π. The common 220V input AC power is transformed into a specific DC power (B+) by the power transformer PT1 and supplies the DC power rectified and smoothed by the rectifier T5 and the smoothing unit 121.

The operation of the input and output signal preservation circuit according to the present invention adapted to the conventional three stage power amplification circuit will be described.

When the DC power of the power unit 120 is supplied to the plate that is the anode terminal of the first stage amplification vacuum tube T2, a grid bias is formed at the bias resistor R5 connected with the grid of the first stage amplification vacuum tube T2, so that the first stage vacuum tube T2 amplifies the AC input signal Vi2 inputted into the grid and outputs to the plate.

At this time, the reactor L4 connected in series with the bias resistor R5 of the input signal preservation unit 130 operates as the AC resistor with respect to the AC input signal Vi2 for thereby increasing the input resistance value together with the bias resistor R5 and preventing a leakage of the AC input signal Vi2.

Thereafter, the output signal amplified by the first stage amplification vacuum tube T2 is inputted into the grid of the second stage amplification vacuum tube T3.

At this time, the load resistor R7 and the first reactor L6 of the amplification signal preservation unit 141 connected with an output terminal of the first stage amplification vacuum tube T2 operate in the same principle as the input signal preservation unit 30 of FIG. 2A for thereby increasing an output resistance value with respect to the amplification output signal at the vacuum tube T2 of the first stage amplification circuit and the AC input signal of the second stage amplification vacuum tube T3 and preventing the attenuation of the amplification output signal (or AC input signal).

The second reactor L5 of the voltage compensation unit 135 connected with an output terminal of the vacuum tube T2 of the first stage amplification circuit operates in the same principle as the first reactor L1 of the input signal preservation unit 30 of FIG. 2A and the first reactor L2 of the output signal preservation unit 40 and increases the output resistance value with respect to the amplification output signal (or AC input signal) at the output terminal of the vacuum tube T2 of the first state circuit for thereby preventing the attenuation of the amplification output signal (or AC input signal).

The condenser C7 of the voltage compensation unit 135 connected with an output terminal of the vacuum tube T2 of the first stage amplification circuit compensates the voltage variation ratio with respect to the amplification output signal (or AC input signal) based on the charging and discharging operation of the charging and discharging condensers C15 and C14 contained in the smoothing unit 121 of the power unit 120 for thereby stabilizing the bias voltage of the first stage amplification vacuum tube T2.

Next, the second amplification vacuum tube T3 amplifies the AC input signal inputted into the grid after it is first-stage amplified by the first stage amplification vacuum tube T2 and outputs to the plate.

At this time, the load resistor R9 and the first reactor L8 of the amplification signal preservation unit 151 connected with an output terminal of the second stage amplification vacuum tube T3 operate in the same principle as the input signal preservation unit 30 of FIG. 2A and increases the output resistance value with respect to the amplification output signal at the output terminal of the vacuum tube T3 of the second stage amplification circuit, namely, the AC input signal of the third stage amplification vacuum tube T4 for thereby preventing the attenuation of the amplification output signal (or AC input signal).

The second reactor L7 of the voltage compensation unit 144 connected with an output terminal of the vacuum tube T3 of the second stage amplification circuit operates in the same principle as the reactor L1 of the input signal preservation unit 30 of FIG. 2A and the first reactor L2 of the output signal preservation unit 40 and increases the output resistance value with respect to the amplification output signal (or AC input signal) at the output terminal of the vacuum tube T3 of the second stage amplification circuit for thereby preventing the attenuation of the amplification output signal (or AC input signal).

The condenser C9 of the voltage compensation unit 144 connected with an output terminal of the vacuum tube T3 of the second stage amplification circuit compensates the voltage variation ratio with respect to the amplification output signal (or AC input signal) based on the charging and discharging operations of the charging and discharging condensers C15 and C14 contained in the smoothing unit 121 of the power unit 120 for thereby stabilizing the bias voltage of the second stage amplification vacuum tube T3.

Finally, the third stage amplification vacuum tube T4 amplifies the AC input signal inputted into the grid after it is second-stage amplified by the second stage amplification vacuum tube T3 and outputs to the plate.

At this time, the second reactor L10 of the voltage compensation unit 143 connected with an output terminal of the third stage amplification vacuum tube T4 operates in the same principle as the reactor L1 of the input signal preservation unit 30 of FIG. 2A and the first reactor L2 of the output signal preservation unit 40 and increases the output resistance value with respect to the amplification output signal at the output terminal of the vacuum tube T4 of the third stage amplification circuit for thereby preventing the attenuation of the amplification output signal.

The condenser C3 of the voltage compensation unit 143 connected with an output terminal of the vacuum tube T4 of the third stage amplification circuit compensates the voltage variation ratio with respect to the amplification signal based on the charging and discharging operations of the charging and discharging condensers C15 and C14 contained in the smoothing unit 121 of the power unit 120 for thereby stabilizing the bias voltage of the third stage amplification vacuum tube T4.

INDUSTRIAL APPLICABILITY

As described above, in the input and output preservation circuit of an amplification circuit according to the present invention, the input resistance values with respect to the AC input signal are increased by connecting the electric devices (for example, bias resistor and reactor) of the input signal preservation with an input terminal of the amplification circuit, and the output resistance values are increased with respect to the amplification signal by connecting the electric devices of the output signal preservation with an output terminal of the amplification circuit for thereby preventing the attenuations of the input signal and the output signal. Therefore, in the present invention, the leakage problem of the AC input signal through the bias resistor connected with an input terminal of the amplification circuit used in various audio systems is overcome. The damaging problem of the amplification device occurring when the resistance value of the bias resistor is set larger than over a few MΩ in order to prevent the leakage of the AC input signal through the bias resistor can be prevented. The leakage problem of the amplification output signal through the load resistor connected with an output terminal of the amplification circuit can be overcome. In addition, the leakage problem of the amplification output signal through the charging and discharging condenser included in the smoothing unit of the power unit of the amplification circuit can be prevented. The noise generation problem of the input and output signal occurring due to the charging and discharging operations of the charging and discharging condensers can be overcome. Namely, all the conventional known problems can be overcome. The present invention is capable of achieving a super high end audio characteristic.

As the present invention may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

The invention claimed is:

1. In an amplification circuit using amplifying devices in an audio system, an input and output signal preservation circuit of an amplification circuit, comprising:
    an input signal preservation unit that is connected with an input terminal of an amplification device of an amplification circuit capable of amplifying an AC input signal using a certain amplification device and outputting the same and increases an input resistance value with respect to the input signal and prevents an attenuation of the input signal; and
    an output signal preservation unit that is connected with an output terminal of the amplification device and increases an output resistance value with respect to the amplification signal and prevents an attenuation of the amplification output signal for thereby compensating a voltage variation ratio with respect to the amplification output signal.
    wherein said input signal preservation unit includes;
    a bias resistor connected in parallel with an input terminal of the amplification device; and
    a reactor that is connected in series with the bias resistor and operates as an AC resistor and increases an input resistance value together with the bias resistor for thereby preventing a leakage of the AC input signal.

2. In an amplification circuit using amplifying devices in an audio system, an input and output signal preservation circuit of an amplification circuit, comprising:
    an input signal preservation unit that is connected with an input terminal of an amplification device of an amplification circuit capable of amplifying an AC input signal using a certain amplification device and outputting the same and increases an input resistance value with respect to the input signal and prevents an attenuation of the input signal; and
    an output signal preservation unit that is connected with an output terminal of the amplification device and increases an output resistance value with respect to the amplification signal and prevents an attenuation of the amplification output signal for thereby compensating a voltage variation ratio with respect to the amplification output signal,
    wherein said output signal preservation unit includes;
    an amplification signal preservation part that includes a load resistor connected in parallel with an output terminal of the amplification device, and a first reactor that is connected in series with the load resistor and operates as an AC resistor and increases an output resistance value together with the load resistor for thereby preventing a leakage of the amplification output signal; and
    a voltage compensation unit that includes a second reactor connected in parallel with a connection point of the load resistor and the first reactor and operating as an AC resistor for thereby increasing an output resistance value together with the load resistor and preventing a leakage of the amplification output signal, and a condenser that is connected in series with the second reactor and compensates the voltage variation ratio of the amplification output signal.

3. In an amplification circuit using amplifying devices in an audio system, an input and output signal preservation circuit of an amplification circuit, comprising:
    an input signal preservation unit that is connected with an input terminal of an amplification device of an amplification circuit capable of amplifying an AC input signal using a certain amplification device and outputting the same and increases an input resistance value with respect to the input signal and prevents an attenuation of the input signal; and
    an output signal preservation unit that is connected with an output terminal of the amplification device and increases an output resistance value with respect to the amplification signal and prevents an attenuation of the amplification output signal for thereby compensating a voltage variation ratio with respect to the amplification output signal,
    wherein said input signal preservation unit includes:
    a bias resistor connected in parallel with an input terminal of the amplification device; and
    a reactor that is connected in series with the bias resistor and operates as an AC resistor and increases an input resistance value together with the bias resistor for thereby preventing a leakage of the AC input signal,
    wherein said output signal preservation unit includes:
    an amplification signal preservation part that includes a load resistor connected in parallel with an output terminal of the amplification device, and a first reactor that is connected in series with the load resistor and operates as an AC resistor and increases an output resistance value together with the load resistor for thereby preventing a leakage of the amplification output signal; and
    a voltage compensation unit that includes a second reactor connected in parallel with a connection point of the load resistor and the first reactor and operating as an AC resistor for thereby increasing an output resistance value together with the load resistor and preventing a leakage of the amplification output signal, and a condenser that is connected in series with the second reactor and compensates the voltage variation ratio of the amplification output signal.

4. The circuit of claim 1, wherein the bias resistor and the reactor provide a bias at the input terminal of the amplification device.

5. The circuit of claim 1, wherein the reactor is a low-frequency choke coil.

* * * * *